United States Patent [19]

Schwefel et al.

[11] 4,306,220
[45] Dec. 15, 1981

[54] INTERPOLATION UTILIZATION APPARATUS

[75] Inventors: Ernst Schwefel, Traunreut; Alfons Baumgartner, Grassau, both of Fed. Rep. of Germany

[73] Assignee: Dr. Johannes Heidenhain GmbH, Traunreut, Fed. Rep. of Germany

[21] Appl. No.: 971,244

[22] Filed: Dec. 20, 1978

[30] Foreign Application Priority Data

Dec. 28, 1977 [DE] Fed. Rep. of Germany ....... 2758525

[51] Int. Cl.³ ............................................. H03K 13/02
[52] U.S. Cl. .......................... 340/347 P; 235/92 MP; 250/231 SE; 340/347 M; 340/347 CC
[58] Field of Search ...................... 340/347 M, 347 P; 250/231 SE; 235/92 MP

[56] References Cited

U.S. PATENT DOCUMENTS

| | | | |
|---|---|---|---|
| 2,886,717 | 5/1959 | Williamson et al. | 250/237 G X |
| 2,886,718 | 5/1959 | Shepherd et al. | 250/237 G X |
| 3,530,458 | 9/1970 | Willard et al. | 340/347 CC |
| 3,588,462 | 6/1971 | Kreckel et al. | 235/92 MP X |
| 3,711,851 | 1/1973 | Giraud et al. | 340/347 CC |
| 3,713,139 | 1/1973 | Sanford et al. | 340/347 P |
| 3,820,096 | 6/1974 | Himmelsbach et al. | 340/204 |
| 4,074,258 | 2/1978 | Dore et al. | 235/92 MP X |

FOREIGN PATENT DOCUMENTS 1498137 3/1969 Fed. Rep. of Germany .
2638621 3/1977 Fed. Rep. of Germany .
1169698 11/1969 United Kingdom .

*Primary Examiner*—Thomas J. Bloyan
*Attorney, Agent, or Firm*—Hume, Clement, Brinks, Willian & Olds, Ltd.

[57] ABSTRACT

An apparatus is disclosed for processing the output of an incremental measuring device of the type which provides a periodic analog output signal. The analog output signal is applied to a trigger circuit to produce a square wave signal which is applied as an input to an updown counter. This counter operates to count the number of complete cycles of the analog signal associated with the measurement. The analog signal is also applied to a circuit which acts to generate a coded intermediate value in response to the sign and amplitude of the analog signal. The counter value and the coded intermediate value are both applied as inputs to a computer which combines these two values to produce a composite reading in which the coded intermediate value supplies the high precision component of the reading and the counter value supplies the low precision component. In this way increased precision readings can be attained without increasing the maximum counting rate of the counter.

14 Claims, 1 Drawing Figure

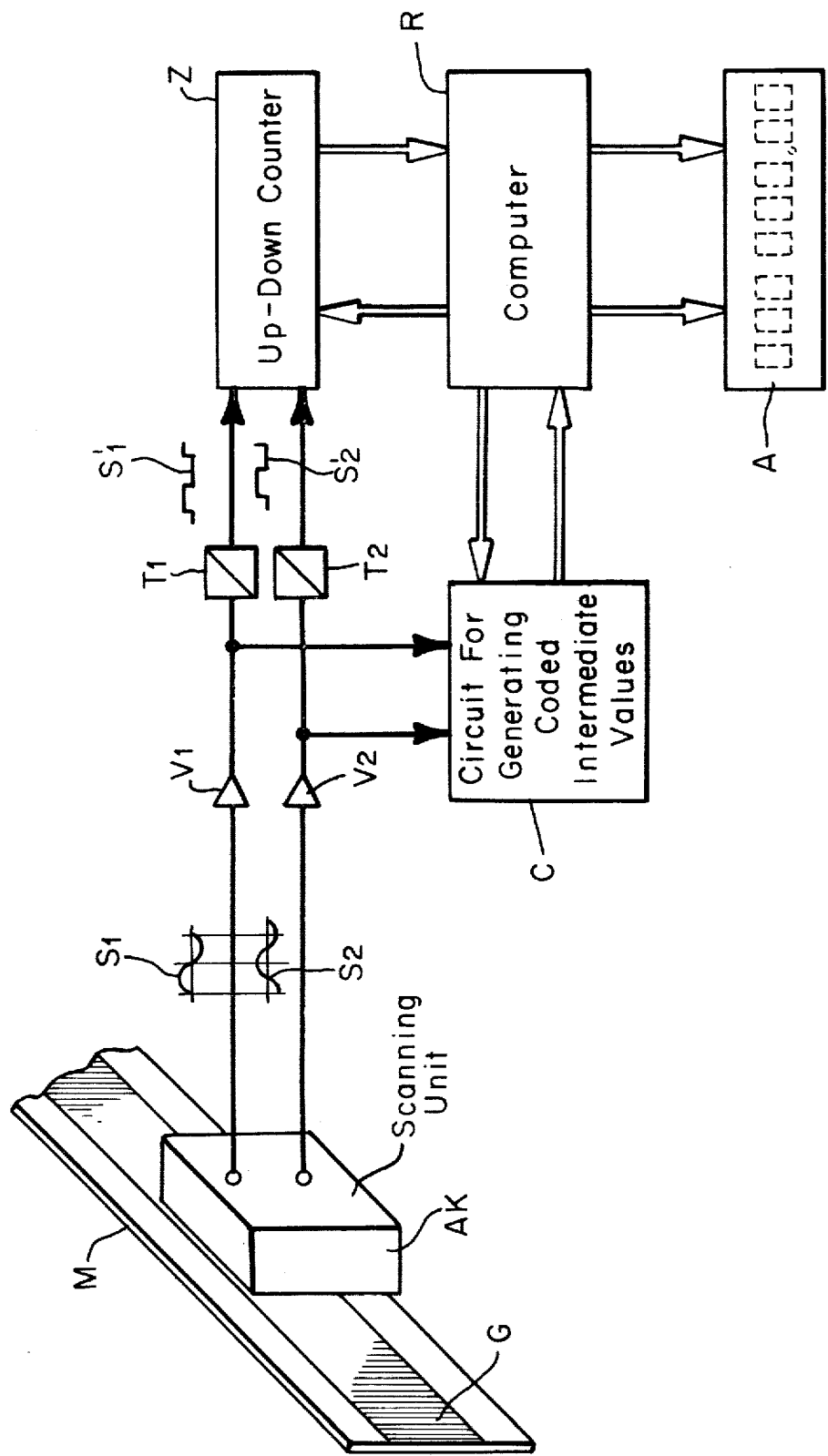

INTERPOLATION UTILIZATION APPARATUS

BACKGROUND OF THE INVENTION

The present invention relates to a measuring instrument for determining the relative position of two objects, and in particular to an improved photoelectric digital length or angle measuring instrument.

A wide range of digital measuring instruments are known to the art. In general, such instruments measure a length or an angle in terms of discrete divisions or intervals formed on a precision scale, and in order to maximize the precision of the measurement it is often desirable to utilize intervals which are as small as possible. However in instruments which use counters to count the number of intervals associated with a measurement, a reduction in the size of the measurement interval will bring with it a concomitant increase in the counting speed of the counter. The precision or resolution of such instruments is limited, therefore, by either the grid constant of the precision scale which is used or the maximum counting speed of the counter.

One class of measuring instruments known to the art utilizes electronic means for subdividing the measurement interval to increase the precision or resolution of the instrument. However, the number of subdivisions provided by prior art instruments is, in practice, quite limited, for the cost and complexity of the circuitry used to properly combine the subdivisions of the measurement intervals with the counted intervals has in the past increased as a function of the number of subdivisions.

SUMMARY OF THE INVENTION

The present invention is directed to an improved measuring instrument which overcomes certain of the foregoing disadvantages of the measuring instruments of the prior system, and which makes it possible to increase the measuring speed and to realize a virtually arbitrary precision at a given counter frequency.

According to this invention, two means are provided for evaluating the output signal of an incremental measuring instrument. Counter means are provided for counting the number of complete cycles or periods of the output signal associated with the measurement to arrive at a relatively coarse measure of position. Also, circuit means are provided for measuring the magnitude of the output signal and generating an intermediate coded value which provides a relatively precise measure of position within a cycle of the output signal. Computer means are used for combining the count stored in the counter means with the intermediate coded value generated by the circuit means to arrive at a composite reading indicative of measured position. The invention itself, together with further objects and attendant advantages, will be best understood by reference to the following description taken in connection with the appended drawing.

BRIEF DESCRIPTION OF THE DRAWING

The drawing is a block circuit diagram of a preferred embodiment of the invention.

DETAILED DESCRIPTION OF A PREFERRED EMBODIMENT

Referring now to the drawing, reference letter M is used to designate a precision scale on which is plotted a regular grid G having a relatively narrow spacing or grid constant. A scanning unit AK scans this grid and generates phase shifted analog signals $S_1$, $S_2$ having a relative phase displacement of 90°. The two signals $S_1$, $S_2$ are amplified in amplifiers $V_1$, $V_2$ and fed, in the first place, to a circuit C which forms an intermediate coded value based on the amplitudes of the signals $S_1$, $S_2$, and, in the second place, to triggers $T_1$, $T_2$, and then to an up-down counter Z, which includes a direction discriminator. In the up-down counter Z the triggered signals $S_1'$, $S_2'$ are counted according to the principle of simple evaluation according to which counting pulses are only generated when the 90° signal $S_2'$ changes state while the 0° signal $S_1'$ is in the Logic 1 state. In the circuit C for generating intermediate coded values corresponding to the analog signals $S_1$, $S_2$ a subdivision is made into a virtually arbitrary number of intermediate coded values (for example 100). These intermediate coded values are dependent on the amplitude and sign of the 0° and 90° signals $S_1$, $S_2$ and thereby on the position of the scanning unit AK on the grid G.

In that the precision of the measurement can be made significantly greater than the precision of the counter, counter operation is necessary only in relatively large steps (for example corresponding to every 100). This makes it possible to obtain both high speed movement of the scanning unit AK and high precision measurement for a given maximum counting rate of the counter Z.

The coded intermediate value generated by the circuit C (hereinafter called the "coded value") and the value stored in the counter Z (hereinafter called the "counter value") are sensed by a computer R, preferably a microprocessor, which properly combines the coded value with the counter value to arrive at a precise measure of position which is output by the computer R via the display A. Preferably the computer R is programmed to form the algebraic sign of the displayed value. Obviously, the computer R can also be programmed to perform other functions, such as controlling a printer, determining the maximum or minimum value in a series of values, or the like. The proper combination of the coded value with the counter value is accomplished by the means that the counter value is augmented by +1 for predetermined signal combinations of the square wave signals $S_1'$, $S_2'$ and the coded values. These predetermined signal combinations are those in a range in which the 90° signal $S_2'$ has the binary value 0, and the instantaneous coded value is less than half the number of the possible coded values.

When the measuring instrument is switched on the counter Z is automatically initialized to zero. For example, with a 1/10 micron counter Z the coded value will appear in the 1/10 micron and 1 micron columns of the display. By operating an erasing key (not shown) the counter Z can be set on zero and the coded value associated with the instantaneous position of the scanning unit (inclusive of the possible +1 addition) can be stored in computer memory and thereafter subtracted from the display A, so that zero appears on the display A. If, for example, the erasing key is operated when the scanning unit AK is positioned such that the instantaneous coded value is 60, then the number 60 is stored in computer memory and the value 000 000 00 appears on the display A. A movement by 1/10 micron to coded value 61 leads to the display 000 000 01 (equal to the instantaneous coded value plus the counter value minus the stored coded value).

| Example: | Instantaneous coded value | 61 |
|---|---|---|
| | Counter value | + 000 000 |
| | | 000 000 61 |
| | Stored coded value | − 60 |
| | Display value | 000 000 01 |

Correspondingly, on further movement of the scanning unit AK to coded value 99, the value 000 000 39 appears in the display A.

A further movement by 1/10 micron in the same direction leads to the coded value 00 and thereby to the beginning of the range in which the +1 addition is made to the counter value. In this range 1 is added to the counter value, thereby yielding the following displayed value:

| Example: | Coded value | 00 |
|---|---|---|
| | Counter value | + 000 000 |
| | Added value | + 1 |
| | | 000 001 00 |
| | Stored coded value | − 60 |
| | Display value | − 000 000 40 |

The counter value is augmented by 1 during further movement of the scanning unit AK in the same direction up to the point where the 90° signal $S_2'$ changes state while the 0° signal $S_1'$ is in the Logic 1 state. At this point a forward counting pulse is generated by the counter Z and the counter value is incremented by one so that the suspension of the addition of +1 to the counter value is offset by the increase of the counter value and, therefore, does not appear at the display A.

| Example: | | | |
|---|---|---|---|
| Before the change of state of the 90° signal: | | After the change of state of the 90° signal: | |
| Coded value | 30 | | 31 |
| Counter value | + 000 000 | + 000 001 | |
| Added value | + 1 | + 0 | |
| Stored coded value | − 60 | − 60 | |
| Display value | 000 000 70 | 000 000 71 | |

In an analogous manner it is also possible to process the so-called setting values which are commonly employed with conventional counters. The setting value is stored in a memory unit in a known manner, and is continuously added to the measuring result arising from the combination of the coded value with the counter value.

Of course it should be understood that various changes and modifications to the preferred embodiment described herein will be apparent to those skilled in the art. For example, the invention is not restricted to photoelectric measuring instruments, but can be used just as advantageously in connection with inductive, magnetic, or capacitative measuring instruments. Likewise, the invention is not limited to use with sinusoidal signals $S_1$, $S_2$, but can also be used with other analog signals, such as triangular signals, for instance. The invention can also be advantageously used in numerically controlled machines. Such changes and modifications can be made without departing from the scope of the present invention and without diminishing its attendant advantages. It is, therefore, intended that such changes and modifications be covered by the following claims.

We claim:

1. An apparatus for processing the output of a measuring instrument for determining the relative position of two objects, wherein said output includes two phase shifted analog signals and said apparatus comprises:

counter means, responsive to the analog signals, for generating a counter value;

circuit means, responsive to the analog signals, for generating a coded interpolation value;

computer means, responsive to the counter means and the circuit means, for combining the counter value with the coded interpolation value to generate a combined representation of the output of the measuring instrument; and means, included in the computer means, for correcting the combined representation by one unit of the counter value during the period between the transition of the interpolation value through its maximum value and the transition of the counter value from one value to the next.

2. The apparatus of claim 1 wherein the counter means includes means for generating a pair of square wave signals in response to the pair of analog signals and the correcting means operates to correct the combined representation by one unit of the counter value for a predetermined range of coded interpolation values, when the pair of square wave signals have predetermined values.

3. The apparatus of claim 2 wherein the pair of square wave signals includes a first square wave signal and the correcting means corrects the combined representation by one unit of the counter value when the first square wave signal has the value Logic 0 and the coded interpolation value is less than half the total number of possible interpolation values.

4. In a measuring instrument for determining the relative position of a first object with respect to a second object, the improvement comprising:

means for generating a first digital signal representative of the position of the first object with respect to the second object;

means for generating a digital interpolation signal representative of the position of the first object with respect to the second object, said interpolation signal having a spatial resolution greater than that of the first digital signal;

means for displaying a composite signal having a spatial resolution greater than that of said first digital signal and representative of the position of the first object with respect to the second object;

computer means, responsive to the first digital signal and to the interpolation signal and coupled to the display means, for combining the first digital signal with the interpolation signal to generate the composite digital signal and for supplying the composite signal to the display means; and means, included in the computer means, for correcting the composite signal by one unit of the first digital signal during the period between the transition of the interpolation signal through its maximum value and the transition of the first digital signal from one value to the next.

5. The measuring instrument improvement of claim 4 wherein the means for generating at least one measurement signal generates at least two periodic, phase shifted, analog signals; the means for generating the first digital signal includes trigger means, responsive to the at least two analog signals, for generating at least two square wave signals, and an up-down counter responsive to the at least two square wave signals; and the means for generating the interpolation signal is responsive to the at least two analog signals.

6. The improvement of claim 4 wherein the computer means includes means for correcting the composite signal by one unit of the first digital signal only when the interpolation signal is within a first predetermined range of values and the at least one measuring signal is within a second predetermined range of values.

7. The improvement of claim 5 wherein the computer means includes means for incrementing the composite signal by one unit of the first digital signal only when the interpolation signal is equal to a value less than one half of the maximum value of the interpolation signal and a predetermined one of the two square wave signals is in a predetermined logic state.

8. The improvement of claims 4 or 5 wherein the computer means includes a micro-processor.

9. In a measuring instrument for determining the relative position of a first object with respect to a second object, said instrument including means for generating at least one analog measuring signal indicative of the relative position of the first object with respect to the second object, the improvement comprising:
   means, responsive to the at least one analog measuring signal, for generating a first digital signal representative of the position of the first object with respect to the second object;
   means, responsive to the at least one analog measuring signal, for generating a digital interpolation signal representative of the position of the first object with respect to the second object, said interpolation signal having a spatial resolution greater than that of the first digital signal;
   means for displaying a composite signal having a spatial resolution greater than that of said first digital signal and representative of the position of the first object with respect to the second object;
   computer means, responsive to the first digital signal and the interpolation signal and coupled to the display means, for combining the first digital signal with the interpolation signal to generate the composite signal and for supplying the composite signal to the display means; and
   means, included in the computer means, for correcting the composite signal by one unit of the first digital signal during the period between the transition of the interpolation signal through its maximum value and the transition of the first digital signal from one value to the next.

10. The improvement of claim 9 wherein the correcting means includes means, operative when the first digital signal is increasing, for augmenting the composite signal by one unit of the first digital signal during the interval after the interpolation value has passed through its maximum value and before the means for generating the first digital signal has incremented the first digital signal.

11. In a measuring instrument for determining the relative position of a first object with respect to a second object, said instrument including a scale mounted to the first object, a scanning unit mounted to the second object to scan the scale and to generate first and second phase shifted periodic analog signals which vary in amplitude as a function of the relative position between the first and second objects, the improvement comprising:
   trigger means for generating first and second square wave signals in response to the first and second analog signals, respectively;
   counter means, responsive to the first and second square wave signals for maintaining a coarse position count;
   interpolation means, responsive to at least one of the first and second analog signals for generating a digital coded interpolation value indicative of position, said coded interpolation value having a spatial resolution greater than that of said coarse position count;
   a computer, responsive to the coarse position count and the coded interpolation value;
   means, included in the computer, for combining the coarse position count with the coded interpolation value to produce a composite signal having a spatial resolution greater than that of the coarse position count; and
   means, included in the computer, for correcting the composite signal by one unit of the coarse position count during the period between the transition of the coded interpolation value through its maximum value and the transition of the coarse position count from one value to the next.

12. The improvement of claim 11 wherein the correcting means includes means, operative when the coarse position count is increasing, for augmenting the composite signal by one unit of the coarse position count during the interval after the coded interpolation value has passed through its maximum value and before the counter means has incremented the coarse position count.

13. In a measuring instrument for determining the relative position of a first object with respect to a second object, said instrument including a scale mounted to the first object, a scanning unit mounted to the second object to scan the scale and to generate first and second phase shifted periodic analog signals which vary in amplitude as a function of the relative position between the first and second objects, the improvement comprising:
   trigger means for generating first and second square wave signals in response to the first and second analog signals, respectively;
   counter means, responsive to the first and second square wave signals for maintaining a coarse position count;
   interpolation means for generating a digital coded interpolation value indicative of position, said coded interpolation value having a spatial resolution greater than that of said coarse position count;
   a computer, responsive to the coarse position count and the coded interpolation value, said computer programmed to combine the coarse position count with the coded interpolation value to produce a composite signal having a spatial resolution greater than that of the coarse position count; and
   means, included in the computer, for incrementing the composite signal by one unit of the coarse position count only when the interpolation value is within a first predetermined range of values and one of the first and second square wave signals is in a first predetermined logic state, in order to correct the composite signal by one unit of the coarse position count during the period between the transition of the interpolation value through its maximum value and the transition of the coarse position count from one value to the next.

14. The improvement of claim 13 wherein said incrementing means increments the composite signal only when the interpolation value is less than one-half the maximum value of the interpolation value and one of the first and second square wave signals is in a first predetermined logic state.

* * * * *